Aug. 1, 1961 J. I. RHODES 2,994,767
POWER CONSERVING MIXER AND OSCILLATOR
Filed Aug. 21, 1958
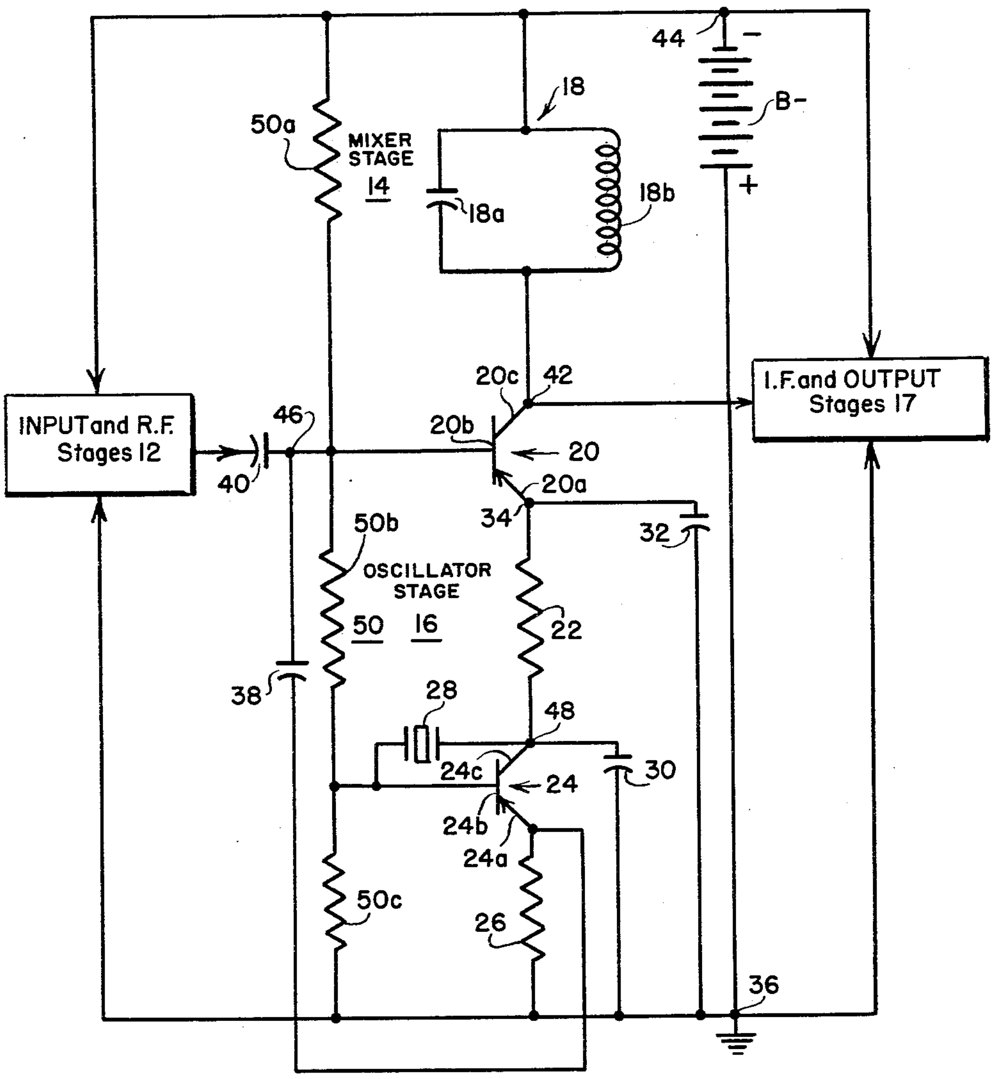
COMMUNICATION RECEIVER 10
INVENTOR.
Junior I. Rhodes
BY
ATTORNEY.

United States Patent Office 2,994,767

Patented Aug. 1, 1961

2,994,767

POWER CONSERVING MIXER AND OSCILLATOR

Junior I. Rhodes, North Syracuse, N.Y., assignor to General Electric Company, a corporation of New York Filed Aug. 21, 1958, Ser. No. 756,326

8 Claims. (Cl. 250—20)

This invention pertains to communication and broadcast receivers and more particularly to the oscillator and mixer stages of communication and broadcast receivers which employ transistors.

In order for transistors to operate, it is necessary to establish direct current operating potentials on their terminals. For example, to render a transistor capable of amplifying or mixing a signal, there must be applied direct operating potentials of predetermined magnitudes to the base, the emitter and the collector of the transistor.

A communication or broadcast receiver includes several amplifier stages as well as a mixer stage and an oscillator stage. In general, the amplifier stages require greater operating potentials than the mixer and oscillator stages. At present, it is common practice to incorporate in a receiver a single source of direct current potential for supplying the operating potentials of the stages. The magnitude of the direct current potential is determined by the stage which requires the greatest operating potential. The remaining stages, such as the mixer and oscillator stages, are either furnished with the same operating potential, even though they may be able to operate with smaller operating potentials, or conventional potential dropping means such as resistors are coupled between the source of direct current potential and the stages which require smaller operating potentials.

It is well known that such techniques waste electrical energy. The extra direct current potential above the operating potential is either wasted in the stage or is dissipated as heat in the potential dropping resistors. In the past, since receivers ordinarily employed vacuum tubes that required operating potentials in the order of a hundred volts, the sources of direct current potentials were rectified alternating current power supplies and the waste could be tolerated. However, particularly with the advent of transistors, battery power supplies have become very attractive since battery power supplies permit receivers to be portable.

In the personal communication field where miniaturization is desirable, the size and weight of the receiver is critical. Thus, the batteries must be as small as possible. If a given communication receiver wastes little electrical energy, the size of the batteries required to power the receiver can be minimized. Further, a battery of a given size can power a more efficient receiver for a longer time than a wasteful receiver.

It is an object of the invention, therefore, to provide improved mixer and oscillator stages for a receiver.

It is another object of the invention to provide for a communication receiver improved transistorized mixer and oscillator stages which efficiently utilize the available electrical energy.

It is a further object of the invention to provide electrical energy conserving mixer and oscillator stages especially adaptable for personal radio communication receivers.

It is a still further object of the invention to provide improved mixer and oscillator stages wherein the electrical energy instead of being wasted in one stage is used to power the other stage.

The invention is embodied in a receiver comprising a mixer stage and an oscillator stage employing transistors. These stages are included in a series circuit which is energized by a battery having first and second terminals at different potentials. The collector of the mixer stage is connected to the first terminal of the battery and the emitter of the oscillator stage is connected to the second terminal of the battery. The emitter of the mixer stage is coupled directly to the collector of the oscillator stage and a signal bypass capacitor is connected between the junction of the two stages and one terminal of the battery. The input signals are fed to the bases of the two stages. Thus one stage operates as a voltage dropping device for the other stage and no power is wasted. The signal bypass capacitor prevents any signal interaction at the junction between the stages.

Other objects, features and advantages of the invention will be evident from the following detailed description when read in connection with the drawing in which the sole figure schematically shows, according to a preferred embodiment of the invention, a transistorized communication receiver in which the series combination of mixer and oscillator stages is energized by the battery which powers the communication receiver.

In order to facilitate an understanding of the invention, the reaction of various electrical components to different types of electrical currents will first be discussed.

In general, all electrical currents can be divided into two types, alternating currents or direct currents. Direct currents have a constant amplitude and direction. Alternating currents periodically vary in magnitude and direction at some frequency. The most common alternating current is sinusoidal. Any electrical signal that varies in any manner can be resolved into a frequency spectrum of alternating currents of the sinusoidal type. Thus, electrical signals are actually combinations of alternating currents.

Most passive electrical components are divided into three types, resistances, inductances and capacitances. Resistances respond in the same way to both direct and alternating current. However, the response of capacitances and inductances is frequency dependent. In general, capacitances present higher admittance to currents having high frequencies of alternation and are open circuits to currents having zero frequency of alternation, i.e., direct currents. On the other hand, inductances present high impedance to currents with high frequencies of alternation and present lesser impedance as the frequency of alternations decreases. In fact, inductances are substantially short circuits to direct currents.

For example, assume the following network of electrical components is fed simultaneously by a direct current and an alternating current: a capacitor in parallel with the serial combination of a resistor and an inductor. The direct current will freely pass via the resistor-inductor branch and will be blocked by the capacitor in the other branch. On the other hand, the alternating current will pass freely via the capacitor branch and be effectively blocked by the resistor-inductor branch. In other words, the electrical components in a branch determine which currents are transmitted by the branch. Thus in an electrical network comprising a resistor or a resistor and inductor in series between first and second terminals and a capacitor coupled between the first terminal and a third terminal with the network fed via the first terminal simultaneously by a source of alternating and direct current, the direct current will flow out of the second terminal and the alternating current will flow out of the third terminal. In other words, the alternating current bypasses the second terminal or in effect the capacitor decouples the first and second terminals with respect to alternating currents, whereas, the resistor or resistor-inductor combination couples the first and second terminals for direct currents.

Referring to the sole figure, a communication receiver 10 is shown comprising input and R.F. (radio frequency) stages 12 feeding signals to a mixer stage 14 which, at the same time, receives heterodyning signals from an oscillator stage 16. The difference frequencies resulting from the heterodyning action are transmitted from the mixer stage 16 to the I.F. (intermediate frequency) and output stages 17.

In general, the input and R.F. stages 12 may comprise an antenna and high gain signal amplifiers. The I.F. and output stages 18 may comprise tuned I.F. signal amplifiers, detection means, audio signal amplifiers and earphones or a speaker.

The mixer stage 14 and the oscillator stage 16 are serially connected across a source of direct current potential B— which is preferably a battery. The mixer stage 14 includes the tank circuit 18, tuned to the intermediate frequency, in series with the transistor 20.

The oscillator stage 16 includes the resistor 22, the transistor 24 and the resistor 26 in series relationship, the piezoelectric crystal 28 and the capacitor 30. A capacitor 32 is coupled from the junction 34 of the mixer stage 14 and the oscillator stage 16 to a terminal 36 of the source of direct current potential B— to bypass alternating current. A capacitor 38 provides the desired signal coupling between the transistors 20 and 24.

In general, a signal to be mixed is fed via capacitor 40 to the mixer stage 14. At the same time, the oscillator stage 16 is transmitting a constant frequency alternating current signal via capacitor 38 to the mixer stage 14. The difference frequencies are transmitted from the output terminal 42 of mixer stage 14.

More particularly, the transistor 20 (a p-n-p type) comprises three elements: an emitter *20a*, a base *20b* and a collector *20c*. The collector *20c* is coupled via tank circuit 18 to the negative terminal 44 of source of direct current potential B—. Tank circuit 18 comprises the capacitor *18a* (which may be fixed or variable) and the inductor *18b* connected in parallel relation. The base *20b* is coupled to the junction 46 of the capacitors 38 and 40. The input and R.F. stages 12 is coupled to base *20b* via capacitor 40. The emitter *20a* is coupled to the junction 34 of resistor 22 and capacitor 32 which bypasses junction 34 to the positive terminal 36 of source of direct current potential B—. Positive terminal 36 may be grounded or connected to some other source of reference potential.

The transistor 24 (a p-n-p type) comprises three elements: an emitter *24a*, a base *24b* and a collector *24c*. Collector *24c* is coupled to the junction 48 of resistor 22 and capacitor 30, the other end of which is connected to positive terminal 36. The piezoelectric crystal 28 is connected between collector *24c* and base *24b*. The emitter *24a* is connected via resistor 26 to the positive terminal 36 of source of direct current potential B—. A potential divider network 50 comprising the series resistors *50a*, *50b* and *50c* is connected across the terminals 36 and 44 of the source of direct current potential B—. The intermediate junctions of potential divider network 50 are respectively connected to bases *20b* and *24b* to provide operating potentials for the bases *20b* and *24b*.

The capacitor 38 couples the emitter *24a*, the output terminal of the oscillator stage 16, to the junction 46, the input terminal of the mixer stage 14. Junction 42, the output terminal of mixer stage 14, is coupled to I.F. and output stages 17. Input and R.F. stages 12 and I.F. and output stages 17 are coupled between negative terminal 44 and positive terminal 36 of source of direct current potential B—.

The resistors *50a*, *50b* and *50c* are chosen to establish operating potentials on the bases *20b* and *24b* which ensure a predetermined direct current flow through the transistors 20 and 24. This direct current flow, particularly through resistors 22 and 26, establishes the operating potentials for the emitters *20a* and *24a* and the collectors *20c* and *24c* of the transistors 20 and 24.

In the presence of this direct current flow, oscillator stage 16 breaks into oscillations having a frequency determined by the piezoelectric crystal 28. Alternating, oscillation frequency current flows in the circuit comprising transistor 24, resistor 22, capacitor 32 and resistor 26. The resultant alternating potential developed across resistor 26 is fed via capacitor 38 to junction 46. When an alternating current signal is received at junction 46 via capacitor 40 from the input and R.F. stages 12, a heterodyning action takes place in the mixer stage 14. The tank circuit 18, by a suitable choice of capacitor *18a* and inductor *18b*, is tuned to the intermediate frequency of the communication receiver 10, and an alternating current having this frequency flows through a circuit comprising transistor 20, capacitor 32, source of direct current potential B—, and tank circuit 18. The alternating current voltage developed across tank circuit 18 because of this current flow is fed from output terminal 42 to the I.F. and output stages 17.

It should be noted that in no way is there a flow of alternating current between the emitter *20a* of transistor 20 and the collector *24c* of transistor 24. Any generated alternating currents are bypassed by capacitor 32 which provides alternating current decoupling between the mixer stage 14 and the oscillator stage 16. All required signal coupling between these stages is performed by capacitor 38.

It should be noted that capacitor 38 performs two additional functions; i.e., it provides a return path to ground via transistor 20 and capacitor 32 in order to aid and in some cases to maximize the oscillating ability of oscillator stage 16 and it provides signal frequency isolation between the oscillator stage 16 and the other stages.

It should also be noted that resistor 22 has the dual function of being the collector load impedance for transistor 24 of oscillator stage 16 and the direct current stabilization resistor for transistor 20 of mixer stage 14.

There has thus been shown improved mixer and oscillator stages which efficiently utilize the available electrical energy. This efficient utilization of energy is accomplished by serially connecting the stages across a battery so that the electrical energy instead of being wasted in one stage is used to power the other stage. Although such a disposition of mixer and oscillator stages is very useful in communication and broadcast receivers, it is admirably suited for personal communication receivers which have strict size and weight requirements.

While only one embodiment of the invention has been described in detail, it should be apparent that many modifications and changes may readily be made without departing from the spirit and scope of the invention.

What is claimed is:

1. In combination, mixer and oscillator stages comprising first and second transistors, each of said transistors having a base, a collector and an emitter, a source of direct current potential having first and second terminals, a tank circuit connected between the collector of said first transistor and the first terminal of said source of direct current potential, first direct current coupling means coupling the emitter of said first transistor to the collector of said second transistor, second direct current coupling means coupling the emitter of said second transistor to the second terminal of said source of potential, said tank circuit and said first and second direct current coupling means cooperating with said first and second transistors to establish direct current operating potentials on the emitters and collectors of said first and second transistors, means coupling the bases of said first and second transistors to the first and second terminals of said source of direct current potential for establishing operating potentials on the bases of said first and second transistors, a signal bypass capacitor coupling the emitter of said first transistor to a terminal of said source of direct current potential, resonance means coupling the collector of said second transistor to the base of said second transistor to control the frequency of the oscillator stage, a signal coupling capacitor coupling the emitter of said second transistor to the base of said first transistor for feeding the signal from the oscillator stage to the mixer stage, a source of signal to be mixed, means coupling said source of signal to be mixed to the base of said first transistor, a utilization means for receiving the mixed signal, and means coupling the collector of said first transistor to said utilization means.

2. In combination, mixer and oscillator stages comprising first and second transistors, each of said transistors having a base, a collector and an emitter, a source of direct current potential having first and second terminals, a tank circuit connected between the collector of said first transistor and the first terminal of said source of direct current potential, a first resistor coupling the emitter of said first transistor to the collector of said second transistor, a second resistor coupling the emitter of said second transistor to the second terminal of said source of potential, serial third, fourth and fifth resistors connected between the first and second terminals of said source of direct current potential, means for coupling the base of said first transistor to the junction of said third and fourth resistors, means for coupling the base of said second transistor to the junction of said fourth and fifth resistors, said tank circuit and said resistors establishing direct current operating potentials on the bases, emitters and collectors of said first and second transistors, a signal bypass capacitor coupling the emitter of said first transistor to the second terminal of said source of direct current potential, a capacitor coupling the collector of said second transistor to one of the terminals of said source of direct current potential, a piezoelectric crystal coupling the collector of said second transistor to the base of said second transistor to control the frequency of the oscillator stage, a first signal coupling capacitor coupling the emitter of said second transistor to the base of said first transistor for feeding the signal from the oscillator stage to the mixer stage, a source of signal to be mixed, a second signal coupling capacitor for coupling said source of signal to be mixed to the base of said first transistor, a utilization means for receiving the mixed signal, and means for coupling the collector of said first transistor to said utilization means.

3. In combination, mixer and oscillator stages comprising first and second transistors respectively, each of said transistors having first, second and third elements, a source of direct current potential having first and second terminals, a tank circuit in circuit relation with said first transistor to select signals of predetermined frequencies, means for coupling the first element of said first transistor to the first terminal of said source of direct current potential, direct current coupling means for coupling the third element of said first transistor to the first element of said second transistor, means for coupling the third element of said second transistor to the second terminal of said source of direct current potential, signal bypass means for coupling said direct current coupling means to one terminal of said source of direct current potential for preventing any signal transfer between said first and second transistors via said direct current coupling means, a resonant element in circuit relation with said second transistor for controlling the frequency of said oscillator stage, and means for coupling one of the elements of said second transistor to the second element of said first transistor for feeding signals from said oscillator stage to said mixer stage.

4. In combination with a signal source, mixer and oscillator stages comprising first and second transistors respectively, each of said transistors having first, second and third elements, a source of direct current potential having first and second terminals, a tank circuit in circuit relation with said first transistor to select signals of predetermined frequencies, means for coupling the first element of said first transistor to the first terminal of said source of direct current potential, means for coupling the second element of said first transistor to said signal source, direct current coupling means for coupling the third element of said first transistor to the first element of said second transistor, means for coupling the third element of said second transistor to the second terminal of said source of direct current potential, signal bypass means for coupling said direct current coupling means to one terminal of said source of direct current potential for preventing any signal transfer between said first and second transistors via said direct current coupling means, a resonant element in circuit relation with said second transistor for controlling the frequency of said oscillator stage, and means for coupling one of the elements of said second transistor to the second element of said first transistor for feeding signals from said oscillator stage to said mixer stage for mixing with signals received from said signal source.

5. The combination of claim 1 wherein said source of direct current potential is a battery.

6. The combination of claim 2 wherein said source of direct current potential is a battery.

7. The combination of claim 3 wherein said source of direct current potential is a battery.

8. The combination of claim 4 wherein said source of direct current potential is a battery.

References Cited in the file of this patent

UNITED STATES PATENTS

| | | |
|---|---|---|
| 2,810,110 | Paz | Oct. 15, 1957 |
| 2,811,636 | Achenbach | Oct. 29, 1957 |
| 2,831,968 | Stanley et al. | Apr. 28, 1958 |
| 2,887,573 | Hruska | May 19, 1959 |